United States Patent
Lee

(10) Patent No.: US 8,705,276 B2
(45) Date of Patent: Apr. 22, 2014

(54) SEMICONDUCTOR MEMORY DEVICE, READING METHOD THEREOF, AND DATA STORAGE DEVICE HAVING THE SAME

(75) Inventor: Wan Seob Lee, Icheon-si (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 13/599,814

(22) Filed: Aug. 30, 2012

(65) Prior Publication Data
US 2013/0135928 A1 May 30, 2013

(30) Foreign Application Priority Data
Nov. 30, 2011 (KR) .................. 10-2011-0126973

(51) Int. Cl.
G11C 11/34 (2006.01)
G11C 16/04 (2006.01)
G11C 7/24 (2006.01)

(52) U.S. Cl.
CPC ................................ *G11C 7/24* (2013.01)
USPC .......... 365/185.03; 365/189.011; 365/189.15; 365/230.01; 711/E12.001

(58) Field of Classification Search
USPC .......... 365/185.03, 189.011, 189.15, 230.01; 714/E11.006; 711/E12.001
See application file for complete search history.

(56) References Cited

U.S. PATENT DOCUMENTS

| | | | |
|---|---|---|---|
| 2007/0171711 A1* | 7/2007 | Kang et al. ............... | 365/185.03 |
| 2011/0157999 A1* | 6/2011 | Yoon ........................ | 365/185.22 |
| 2012/0106247 A1* | 5/2012 | Shin ......................... | 365/185.03 |

FOREIGN PATENT DOCUMENTS

KR  10-2010-0070026 A  6/2010

* cited by examiner

*Primary Examiner* — Ly D Pham
(74) *Attorney, Agent, or Firm* — William Park & Associates Patent Ltd.

(57) ABSTRACT

A reading method of a semiconductor memory device having a multi-level memory cell includes the steps of: reading flag data indicating whether the most significant bit (MSB) of data programmed in the multi-level memory cell is programmed or not; storing the read flag data; reading the least significant bit (LSB) of the data programmed in the multi-level memory cell, based on the read flag data; and reading the MSB of the data programmed in the multi-level memory cell based on the stored flag data.

18 Claims, 10 Drawing Sheets

SEMICONDUCTOR MEMORY DEVICE, READING METHOD THEREOF, AND DATA STORAGE DEVICE HAVING THE SAME

CROSS-REFERENCES TO RELATED APPLICATION

The present application claims priority under 35 U.S.C. §119(a) to Korean application number 10-2011-0126973, filed on Nov. 30, 2011, in the Korean Intellectual Property Office, which is incorporated herein by reference in its entirety.

BACKGROUND

1. Technical Field

The present invention relates generally to a semiconductor memory device, and more particularly to a reading method of a nonvolatile memory device.

2. Related Art

In general, a semiconductor memory device is classified into a volatile memory device and a nonvolatile memory device. The volatile memory device loses data stored therein when power supply is interrupted or switched off, but the nonvolatile memory device maintains data stored therein even in absence of power supply.

There are various types of nonvolatile memory devices. The nonvolatile memory device may be divided into a flash memory device, a ferroelectric RAM (FRAM) using a ferroelectric capacitor, a magnetic RAM (MRAM) using a tunneling magneto-resistive (TMR) layer, a phase change memory device using chalcogenide alloys and the like.

Among the nonvolatile memory devices, the flash memory device is roughly divided into a NOR flash memory device and a NAND flash memory device, depending on the configuration of memory cells and bit lines. The NOR flash memory device has a structure in which two or more memory cell transistors are coupled in parallel to one bit line. Therefore, the NOR flash memory device has an excellent random access time characteristic. On the other hand, the NAND flash memory device has a structure in which two or more memory cell transistors are coupled in series to one bit line. Such a structure is referred to as a cell string, and one bit line contact is required per one cell string. Therefore, the NAND flash memory device has an excellent characteristic in terms of integration degree.

The semiconductor memory device such as the NAND flash memory device may include a multi-level cell (MLC) capable of storing two or more-bit data per memory cell to increase the storage capacity. For example, an MLC to store two-bit data may store two bits of the most significant bit (MSB) and the least significant bit (LSB).

In a read operation for the MLC, a flag cell may be used to quickly perform the read operation. The flag cell stores information on whether the MSB was programmed in the MLC or not. According to whether the flag cell was programmed or not, the read operation algorithm of the NAND flash memory device may vary. For example, when it is determined that the flag cell was not programmed, the read operation for the MSB may be omitted. On the other hand, when it is determined that the flag cell was programmed, the read operation for the MSB may be normally performed.

In order to quickly perform the read operation of the NAND flash memory device, an operation of checking the state of the flag cell is performed. In some cases, however, a read operation for checking the state of the flag cell may be added. In this case, the added read operation may serve as a factor which degrades the read performance of the NAND flash memory device.

SUMMARY

A semiconductor memory device, of which the read operation is improved, a reading method thereof, and a data storage device having the same are described herein.

In an embodiment of the present invention, a reading method of a semiconductor memory device having a multi-level memory cell includes the steps of: reading flag data indicating whether the most significant bit (MSB) of data programmed in the multi-level memory cell is programmed or not; storing the read flag data; reading the least significant bit (LSB) of the data programmed in the multi-level memory cell, based on the read flag data; and reading the MSB of the data programmed in the multi-level memory cell based on the stored flag data.

In an embodiment of the present invention, a semiconductor memory device includes: a memory cell array including a multi-level memory cell arranged at a region where a word line and a bit line cross each other and a flag memory cell configured to store information on whether the MSB of data programmed in the multi-level memory cell is programmed or not; a data input/output circuit configured to read data programmed in the multi-level memory cell and the flag memory cell and temporarily store the read data; and a control logic configured to control the read operations for the multi-level memory cell and the flag memory cell through the data input/output circuit. The control logic reads the MSB of the data programmed in the multi-level memory cell based on flag data which is read and stored when reading the LSB of the data programmed in the multi-level memory cell.

In an embodiment of the present invention, a data storage device includes: a semiconductor memory device; and a controller configured to control the semiconductor memory device. The semiconductor memory device includes: a memory cell array including a multi-level memory cell arranged at a region where a word line and a bit line cross each other and a flag memory cell configured to store information on whether the MSB of data programmed in the multi-level memory cell is programmed or not; a data input/output circuit configured to read data programmed in the multi-level memory cell and the flag memory cell and temporarily store the read data; and a control logic configured to control the read operations for the multi-level memory cell and the flag memory cell through the data input/output circuit, and the control logic reads the MSB of the data programmed in the multi-level memory cell based on the flag data which is read and stored when reading the LSB of the data programmed in the multi-level memory cell.

BRIEF DESCRIPTION OF THE DRAWINGS

Features, aspects, and embodiments are described in conjunction with the attached drawings, in which.

DETAILED DESCRIPTION

Hereinafter, a semiconductor memory device, a reading method thereof, and a data storage device having the same according to the present invention will be described below with reference to the accompanying drawings through exemplary embodiments.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

The drawings are not necessarily to scale and in some instances, proportions may have been exaggerated in order to clearly illustrate features of the embodiments. In this specification, specific terms have been used. The terms are used to describe the present invention, and are not used to qualify the sense or limit the scope of the present invention.

In this specification, 'and/or' represents that one or more of components arranged before and after 'and/or' is included. Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exists or are added.

Figure 1:
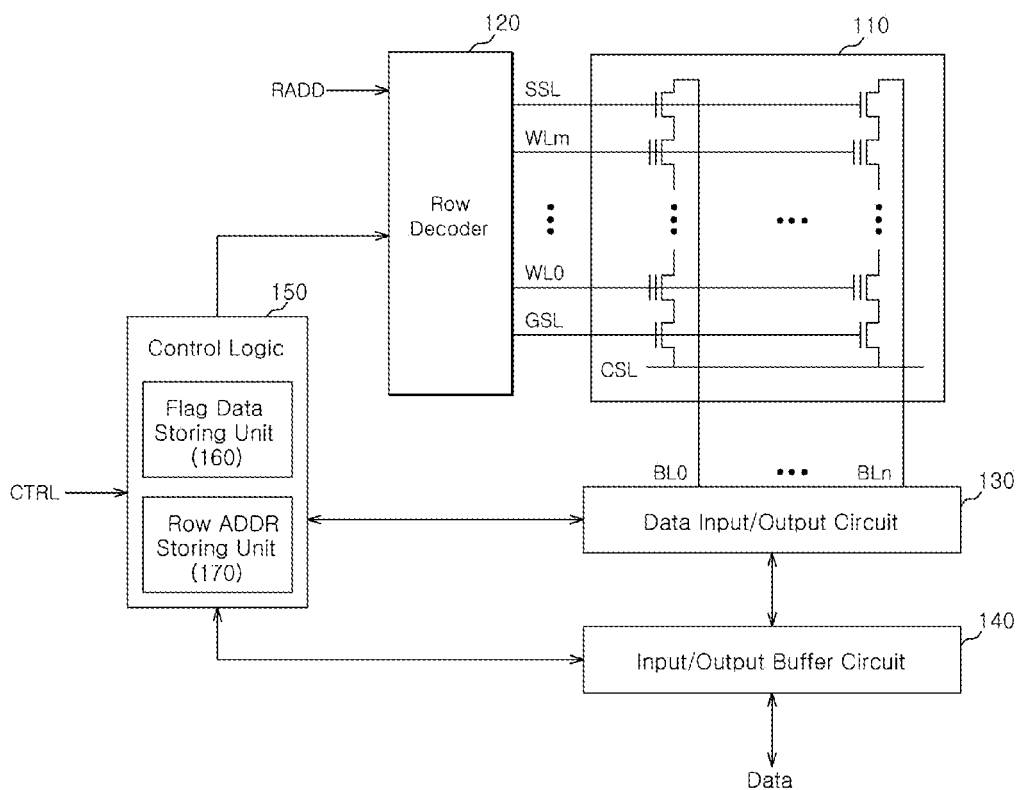
FIG. 1 is a block diagram illustrating a semiconductor memory device according to an embodiment of the present invention.

FIG. 1 is a block diagram illustrating a semiconductor memory device according to an embodiment of the present invention. Referring to FIG. 1, the semiconductor memory device 100 includes a memory cell array 110, a row decoder 120, a data input/output circuit 130, an input/output buffer circuit 140, and a control logic 150. The memory cell array 110 includes a plurality of memory cells arranged, for example, at the respective intersections between bit lines BL0 to BLn and word lines WL0 to WLn. A memory cell storing one-bit data is referred to as a single level cell (SLC). Each SLC is programmed in such a manner as to have a threshold voltage corresponding to one among an erased state and one programmed state. As another example, a memory cell storing two or more-bit data is referred to as a multi level cell (MLC). Each MLC is programmed in such a manner as to have a threshold voltage corresponding to one among an erased state and a plurality of programmed states.

The row decoder 120 is configured to select the word lines WL0 to WLm in response to a row address RADD. The row decoder 120 is configured to transfer various word line voltages provided from a voltage generator (not illustrated) to a selected word line and unselected word lines. For example, the row decoder 120 may transfer a read voltage to the selected word line and transfer a certain voltage for turning on cell transistors corresponding to the unselected word lines, during a read operation. As another example, the row decoder 120 may transfer a program voltage to the selected word line and transfer a pass voltage to the unselected word lines, during a program operation.

The data input/output circuit 130 operates according to the control of the control logic 150. The data input/output circuit 130 is configured to operate as a write driver or sense amplifier depending on an operation mode. For example, the data input/output circuit 130 may store data inputted through the input/output buffer circuit 140 in a memory cell of the memory cell array 110, during a program operation. As another example, the data input/output circuit 130 may output data read from a memory cell of the memory cell array 110 through the data input/output buffer circuit 140, during a read operation. The data input/output circuit 130 may include a plurality of data input/output circuits coupled to the respective bit lines BL0 to BLn. For this reason, the bit lines BL0 to BLn may be selected or controlled by the respective data input/output circuits. Also, in the case of the NAND flash memory device, the data input/output circuit 130 may comprise a page buffer.

The control logic 150 is configured to control overall operations of the semiconductor memory device 100 in response to a control signal CTRL provided from an external device (for example, a memory controller, a memory interface, a host or the like). For example, the control logic 150 may control read, program (or write), and erase operations of the semiconductor memory device 100. For this operation, the control logic 150 may control the data input/output circuit 130.

The control logic 150 according to an embodiment of the present invention includes a flag data storing unit 160 and a row address storing unit 170. The flag data storing unit 160 is configured to store data read from a flag cell. For example, the flag data storing unit 160 may include a register configured to store flag data. The row address storing unit 170 is configured to store a row address which is accessed to read the flag data stored in the flag data storing unit 160. For example, the row address storing unit 170 may include a register configured to store a row address.

According to an embodiment of the present invention, the semiconductor memory device 100 may use the flag data stored in the flag data storing unit 160 in the next read operation. Whether or not the flag data stored in the flag data storing unit 160 is used for the next read operation may be decided according to the row address stored in the row address storing unit 170. The reading method according to an embodiment of the present invention, in which flag data read in a previous read operation is used for a next read operation, will be described below in detail with reference to the is accompanying drawings.

Figure 2:
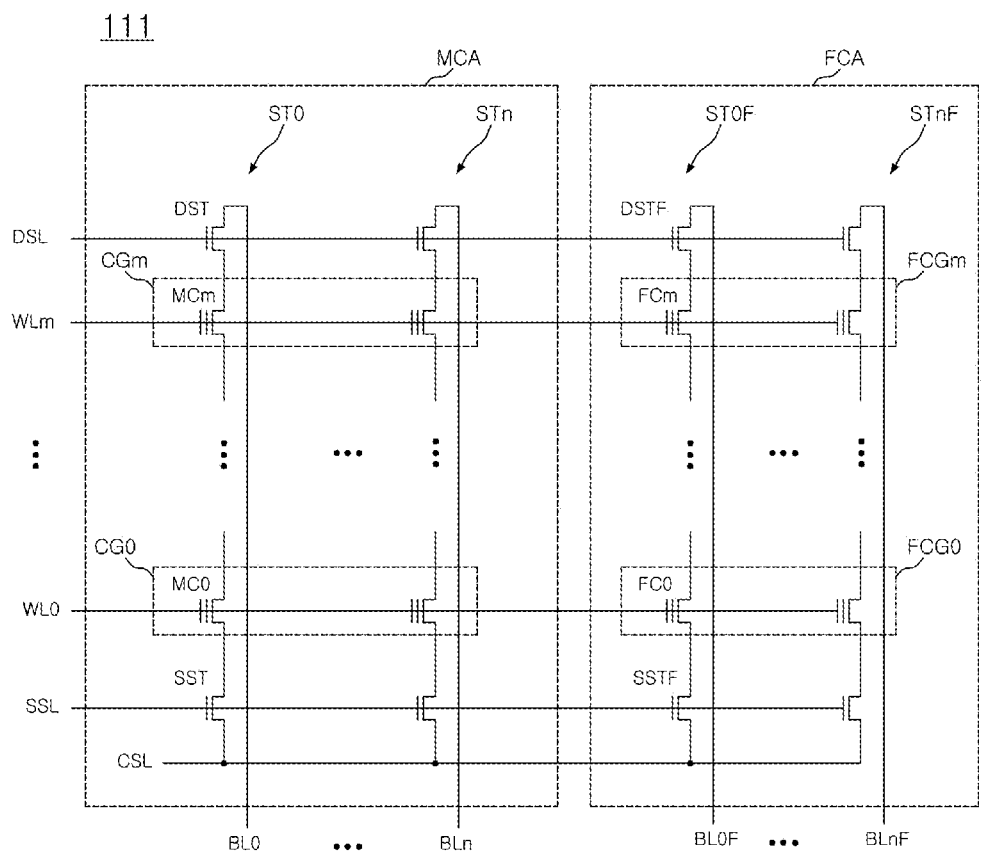
FIG. 2 is a circuit diagram illustrating a memory block of the semiconductor memory device according to an embodiment of the present invention
Figure 3:
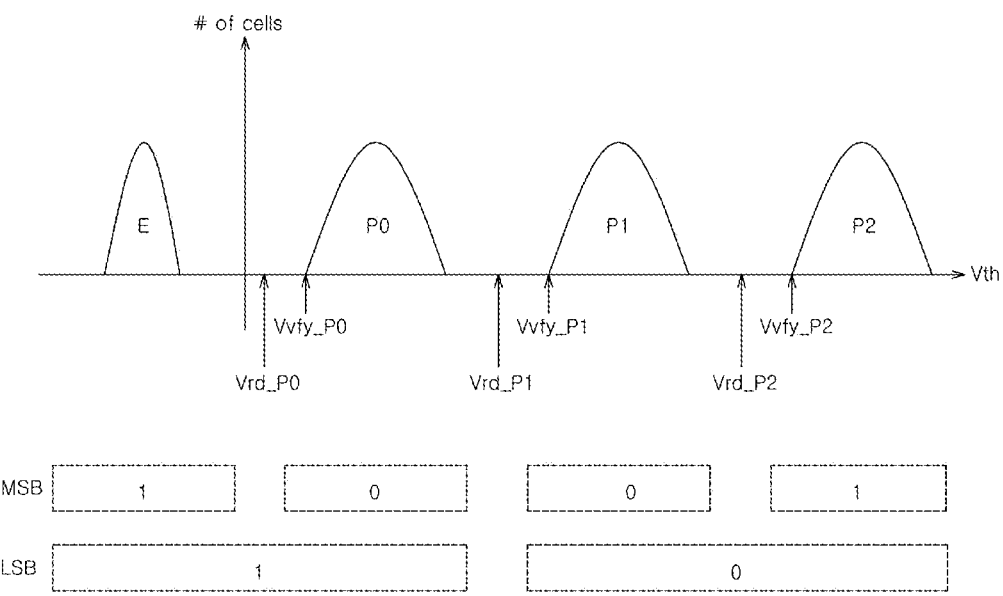
FIG. 3 is a diagram illustrating threshold voltage distributions of semiconductor memory cells according to an embodiment of the present invention.

FIG. 2 is a circuit diagram illustrating a memory block of the semiconductor memory device according to an embodiment of the present invention. FIG. 3 is a diagram illustrating threshold voltage distributions of semiconductor memory cells according to an embodiment of the present invention. The memory cell array 110 of the semiconductor memory device 100 of FIG. 1 may include a plurality of memory blocks. Each of the memory blocks of the memory cell array 110 may be configured in the same manner as the memory block illustrated in FIG. 2.

The memory block 111 includes a main cell area MCA and a flag cell area FCA. The main cell area MCA is an area for storing data provided from the outside of the semiconductor memory device. Although not illustrated, the main cell area MCA may include a main area and a spare area. The main area is where user data provided from the outside of the semiconductor memory device is stored. The spare area is where information related to the user data stored in the main area, for example, metadata such as an error correction code is stored.

The main cell area MCA includes, for example, a plurality of cell strings ST0 to STn coupled to a plurality of bit lines BL0 to BLn. The cell strings ST0 to STn may have the same circuit configuration. For convenience of description, one cell string ST0 will be taken as a representative example.

The cell string ST0 includes a plurality of memory cells MC0 is to MCm and select transistors DST and SST, which are coupled between a bit line BL0 and a common source line SSL. For example, the cell string ST0 includes a drain select transistor DST coupled to a drain select line DSL, a plurality of memory cells MC0 to MCm coupled to a plurality of word lines WL0 to WLm, respectively, and a source select transistor SST coupled to a source select line SSL.

The flag cell area FCA includes, for example, a plurality of flag cell strings ST0F to STnF coupled to a plurality of flag bit lines BL0F to BLnF, respectively. The flag cell strings ST0F to STnF may have the same circuit configuration. For convenience of description, one flag cell string ST0F will be taken as a representative example.

The flag cell string ST0F includes a plurality of flag cells FC0 to FCm and select transistors DSTF and SSTF, which are coupled between the bit line BL0F and the common source line CSL. For example, the flag cell string ST0F includes a drain select transistor DSTF coupled to the drain select line DSL, a plurality of flag cells FC0 to FCm coupled to the respective word lines WL0 to WLm, and a source select transistor SSTF coupled to the source select line SSL.

Although not illustrated, the data input/output circuit 130 may include a plurality of data input/output circuits coupled to the respective bit lines BL0 to BLn of the main cell area MCA and a plurality of input/output circuits coupled to the respective flag bit lines BL0F to BLnF of the flag cell area FCA.

Each of the flag cells of the flag cell area FCA is used as a storage element for storing information on whether any one of memory cells of the corresponding main cell area MCA was MSB-programmed or not. Therefore, the flag cell area FCA is a hidden area which a user cannot access, unlike the main cell area MCA for storing user data. In order to simplify the descriptions, a main cell group CGm of the main cell area MCA and a flag cell group FCGm corresponding thereto will be taken as an example.

Each memory cell of the main cell group CGm may store a plurality of data bits (for example, two or more bit-data). Such a memory cell is referred to as an MLC. For example, as illustrated in FIG. 3, the MLC is programmed in such a manner as to have a threshold voltage corresponding to one among an erased state E and a plurality of programmed states P0 to P2.

When each memory cell of the main cell group CGm stores two-bit data as illustrated in FIG. 3, a high bit (hereafter, referred to as MSB) and a low bit (hereafter, referred to as LSB) are programmed. When the MSB is programmed during a program operation, a corresponding flag cell is programmed. For example, when any one of the memory cells of the main cell group CGm is MSB-programmed, all flag cells of the corresponding flag cell group FCGm are programmed. Here, for example, each of the flag cells of the flag cell group FCGm stores one-bit data. That is, each of the flag cells of the flag cell group FCGm is programmed according to the SLC method.

According to the data stored in the flag cells of the flag cell group FCGm, whether the memory cells of the corresponding main cell group CGm were MSB-programmed or not may be determined. Therefore, an MSB read operation may vary according to whether the flag cells were programmed or not, during a read operation. For example, when it is determined that the flag cells of the flag cell group FCGm were programmed, an MSB read operation for the memory cells of the main cell area CGm may be normally performed. As another example, when it is determined that the flag cells of the flag cell group FCGm were not programmed, the MSB read operation for the memory cells of the main cell area CGm may not be performed. That is, when it is determined that the flag cells of the flag cell group FCGm were not programmed, the MSB read operation for the memory cells of the main cell group CGm may be omitted.

The data stored in the flag cells of the flag cell group FCGm may be changed for a certain reason. For this reason, the flag cells of the flag cell group FCGm may be read through an error test. As such an error test, a majority test may be used. Through the majority test, data holding a majority of the data stored in the flag cells of the flag cell group FCGm may be determined as data stored in the flag cells. When the data of all flag cells included in the flag cell area FCA are read, the majority test may be applied.

Figure 4:
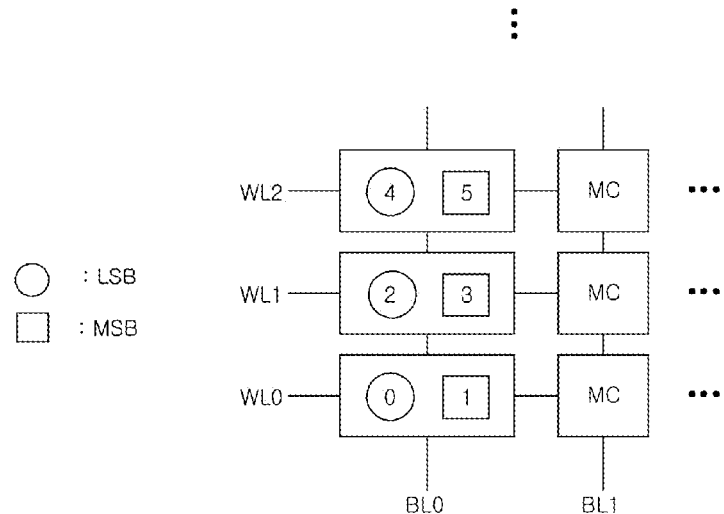
FIG. 4 is a diagram illustrating an address scramble method applied to the multi-level memory device according to an embodiment of the present invention.

FIG. 4 is a diagram illustrating an address scramble method applied to the multi-level memory device according to an embodiment of the present invention. With the increase in the number of data bits stored in a memory cell, a number of row address for accessing a memory cell of a memory device (hereafter, referred to a multi-level memory device) which stores multi-bit (or multi-level) data is increased. In order to efficiently manage such a row address, the address scramble method may be applied to the multi-level memory device.

For example, FIG. 4 illustrates a two-bit MLC array having an all-bit-line architecture and an address scramble method thereof.

In the all-bit-line architecture, all bit lines BL0, BL1, ... of a memory block may be simultaneously selected during a read/program operation, and memory cells coupled to the bit lines may be simultaneously read or programmed by a commonly-coupled word line. The unit of such memory cells may be referred to as a page.

Referring to FIG. 4, the page addresses of memory cells having an all-bit-line architecture are sequentially scrambled according to a word line. For example, an LSB page of memory cells coupled to the word line WL0 may be scrambled to a page address 0, and an MSB page thereof may be scrambled to a page address 1. Furthermore, an LSB page of memory cells coupled to the word line WL1 may be scrambled to a page address 2, and an MSB page thereof may be scrambled to a page address 3. Furthermore, an LSB page of memory cells coupled as the word line WL2 may be scrambled to a page address 4, and an MSB page thereof may be scrambled to a page address 5. The page addresses for the LSB page and the MSB page of memory cells coupled to the subsequent word line may be scrambled in such a manner.

According to an embodiment of the present invention, when the LSB page address and the MSB page address of a memory cell are sequentially scrambled as illustrated in FIG. 4, flag data read during a previous read operation is used for a next read operation. That is, when the LSB page address and the MSB page address of the memory cell are sequentially scrambled, the flag data read in the read operation of the LSB page are used for the read operation of the MSB page.

Figure 5:
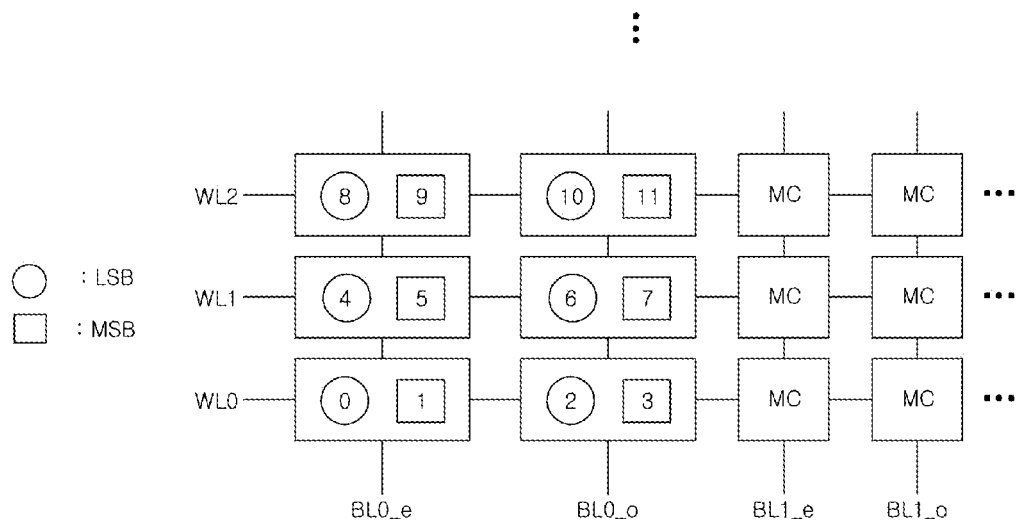
FIG. 5 is a diagram illustrating another address scramble method which is applied to the multi-level memory device according to an embodiment of the present invention.

FIG. 5 is a diagram illustrating another address scramble method which is applied to the multi-level memory device according to an embodiment of the present invention. For example, FIG. 5 illustrates a two-bit MLC array having an even-odd bit line architecture and an address scramble method thereof.

In the even-odd bit line architecture, the bit lines BL0, BL1, . . . are divided into even bit lines BL_e and odd bit lines BL_o. Memory cells coupled to the even bit lines may be simultaneously read or programmed by a commonly-coupled word line. Furthermore, memory cells coupled to the odd bit lines may be simultaneously read or programmed by a commonly-coupled word line. The unit of such memory cells may be referred to as a page. While the memory cells coupled to the odd bit lines are programmed at a first time, the memory cells coupled to the even bit lines are programmed at a second time.

Referring to FIG. 5, the page addresses of memory cells having an even-odd bit line architecture are sequentially scrambled according to a word line and bit lines (that is, even bit line and odd bit line). For example, an LSB page of memory cells coupled to even bit lines BL0_e, BL1_e, . . . and a word line WL0 may be scrambled to a page address 0, and an MSB page thereof may be scrambled to a page address 1. Furthermore, an LSB page of memory cells coupled to odd bit lines BL0_o, BL1_o, . . . and the word line WL0 may be scrambled to a page address 2, and an MSB page thereof may be scrambled to a page address 3. Furthermore, an LSB page of memory cells coupled to the even bit lines BL0_e, BL1_e, . . . and a word line WL1 may be scrambled to a page address 4, and an MSB page thereof may be scrambled to a page address 5. Furthermore, an LSB page of memory cells coupled to the odd bit lines BL0_o, BL1_o, . . . and the word line WL1 may be scrambled to a page address 6, and an MSB page thereof may be scrambled to a page address 7. The page addresses for the LSB page and the MSB page of memory cells coupled to the subsequent word line may be scrambled in such a manner.

According to an embodiment of the present invention, when the LSB page address and the MSB page address of a memory cell are sequentially scrambled as illustrated in FIG. 5, flag data read during a previous read operation is used for a next read operation. That is, when the LSB page address and the MSB page address of the memory cell are sequentially scrambled, flag data read in a read operation of the LSB page may be used for a read operation of the MSB page.

Figure 6:
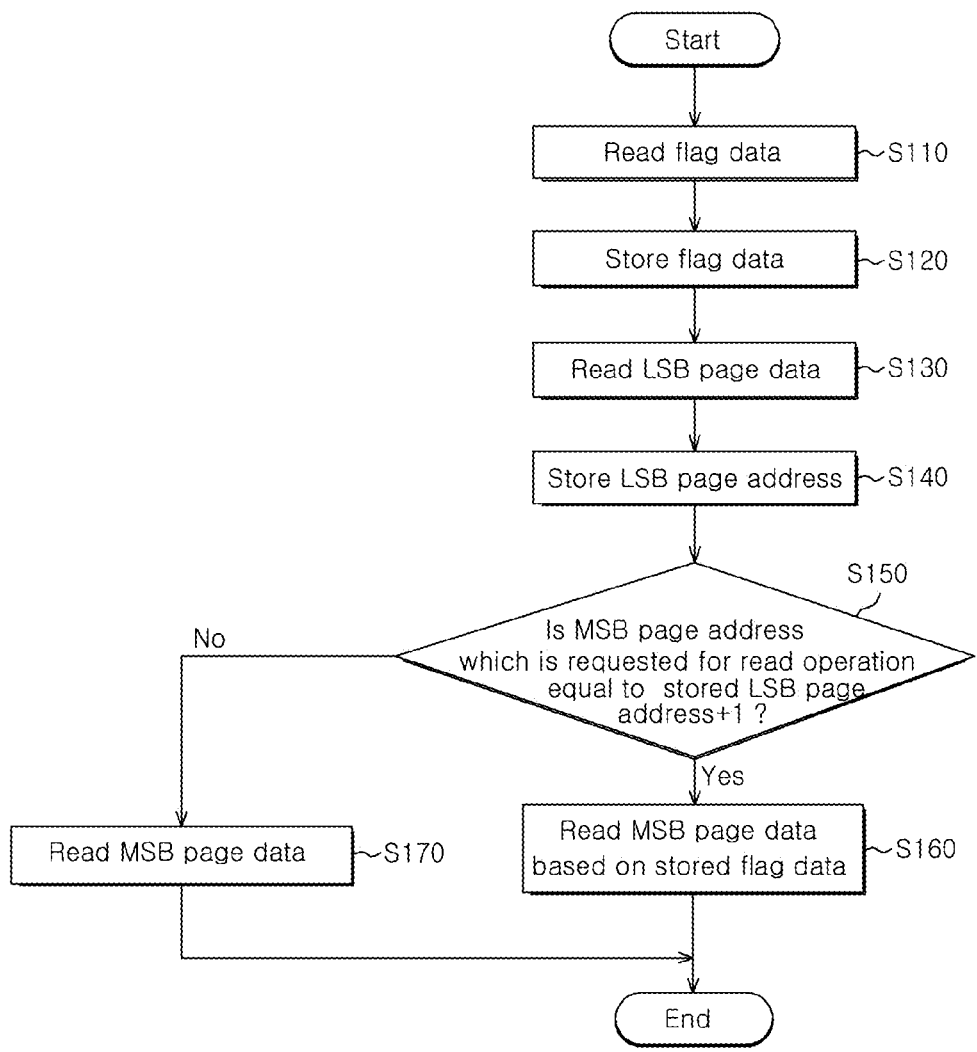
FIG. 6 is a flow chart showing a read operation of the semiconductor memory device according to an embodiment of the present invention.

FIG. 6 is a flow chart showing the read operation of the semiconductor memory device according to an embodiment of the present invention. The read operation of the semiconductor memory device according to an embodiment of the present invention may be divided into a first case and a second case depending on a method of storing and reading flag data. Hereafter, referring to FIGS. 1 to 6, the read operation of the semiconductor memory device according to an embodiment of the present invention will be described in detail.

First, the read operation in the first case will be described as follows.

At step S110, when a read operation for an LSB page of a memory cell is requested, flag data for checking whether MSB data of the memory cell was programmed or not is read. Since the read operation for the LBS page may vary depending on whether the MSB data was programmed or not, the flag data is read from a flag cell. The flag data is read through the data input/output circuit 130.

At step S120, the read flag data is stored in a data latch of the data input/output circuit 130. The read flag data may remain in the data input/output circuit 130 until a read operation for a subsequent MSB page is requested. Furthermore, the read flag data is provided to the control logic 150 so as to be used for the read operation for the LSB page.

At step S130, the data of the LSB page is read based on the read flag data. The LSB data may be read through a well-known read operation such as an LSB page read operation of the multi-level memory device. Therefore, the detailed descriptions thereof will be omitted.

At step S140, a row address of the LSB page requested for a read operation is stored in the row address storing unit 170. That is, the LSB page address requested for the read operation is stored in the row address storing unit 170.

At step S150, whether the flag data read during the previous read operation can be used for the next read operation or not is determined. That is, whether or not an MSB page address which is successively requested for a read operation after the read operation for the LSB page is equal to an address obtained by increasing the stored LSB page address by one is determined at the step S150. Here, the stored LSB page address is the address stored in the row address storing unit 170 at the step S130.

When the MSB page address requested for a read operation is equal to the address obtained by increasing the stored LSB page address by one, the stored flag data may be used for the read operation for the MSB page. In other words, when the sequential read operations for the LSB page and the MSB page of the same memory cell are performed, the flag data for reading the LSB page is used for the read operation for the MSB page. Therefore, the procedure will proceed to step S160.

On the other hand, when the MSB page address requested for a read operation is different from the address obtained by increasing the stored LSB page address by one, the stored flag data is not used for the read operation for the MSB page. In other words, when the sequential read operations for the LSB page and the MSB page of the same memory cell are not performed, the flag data for reading the LSB page is not used for the read operation for the MSB page. Therefore, the procedure will proceed to step S170.

At step S160, when the sequential read operations are performed, the data of the MSB page is read based on the stored flag data. The flag data stored in the data input/output circuit 130 for reading a flag cell may be provided to the control logic 150 so as to be used for the read operation for the MSB page. Furthermore, the provided flag data is used for the read operation for the MSB page. According to an embodiment of the present invention, since the flag data read during the read operation of the LSB page is used for the read operation of the MSB page, a flag data read operation for the read operation of the MSB page may be omitted. For this reason, the read operation of the semiconductor memory device 100 may be efficiently performed.

At step S170, when the sequential read operations are not performed, the MSB data is read out through a general read operation for the MSB page. That is, flag data for checking whether the MSB data of the corresponding memory cell was programmed or not is read out, and the MSB data is read based on the read flag data.

The read operation in the second case has a difference in the step of storing flag data from the read operation in the first case. The read operation in the second case will be described as follows.

At step S110, when a read operation for an LSB page of a memory cell is requested, flag data for checking whether MSB data of the corresponding memory cell was programmed or not is read. Since the read operation for the LSB page may vary according to whether the MSB data was programmed or not, the flag data is read from a flag cell. The flag data is read out through the data input/output circuit 130.

At step S120, the read flag data is stored in the flag data storing unit 160. The flag data stored in the flag data storing unit 160 may maintain the value thereof, until a subsequent read operation for the MSB page is requested.

At step S130, the data of the LSB page is read based on the read flag data. The LSB data may be read through a well-known read operation such as the LSB page read operation of the multi-level memory device. Therefore, the detailed descriptions thereof will be omitted.

At step S140, a row address of the LSB page requested for a read operation is stored in the row address storing unit 170. That is, the LSB page address requested for a read operation is stored in the row address storage unit 170.

At step S150, whether flag data read during a previous read operation may be used for a next read operation is determined. That is, whether or not the MSB page address which is successively requested for a read operation after the read operation for the LSB page is equal to an address obtained by increasing the stored LSB page address by one is determined at the step S150. Here, the stored LSB page address is the address stored in the row address storing unit 170 at step S130.

When the MSB page address requested for a read operation is equal to the address obtained by increasing the stored LSB page address by one, the stored flag data may be used for the read operation for the MSB page. In other words, when the sequential read operations for the LSB page and the MSB page of the same memory cell are performed, the flag data for reading the LSB page may be used for the read operation for the MSB page. Therefore, the procedure will proceed to step S160.

On the other hand, when the MSB page address requested for a read operation is different from the address obtained by increasing the stored LSB page address by one, the stored flag data is not used for the read operation for the MSB page. In other words, when the sequential read operations for the LSB page and the MSB page of the same memory cell are not performed, the flag data for reading the LSB page is not used for the read operation for the MSB page. Therefore, the procedure will proceed to step S170.

At step 160, when the sequential read operations are performed, the data of the MSB page is read based on the flag data stored in the flag data storing unit 160. According to an embodiment of the present invention, since the flag data read during the read operation of the LSB page is used for the read operation of the MSB page, a flag data read operation for the read operation of the MSB page may be omitted. For this reason, the read operation of the is semiconductor memory device 100 may be efficiently performed.

At step S170, when the sequential read operations are not performed, the MSB data is read through a general read operation of the MSB page. That is, flag data for checking whether the MSB data of the corresponding memory cell was programmed or not is read, and the MSB data is read based on the read flag data.

Figure 7:
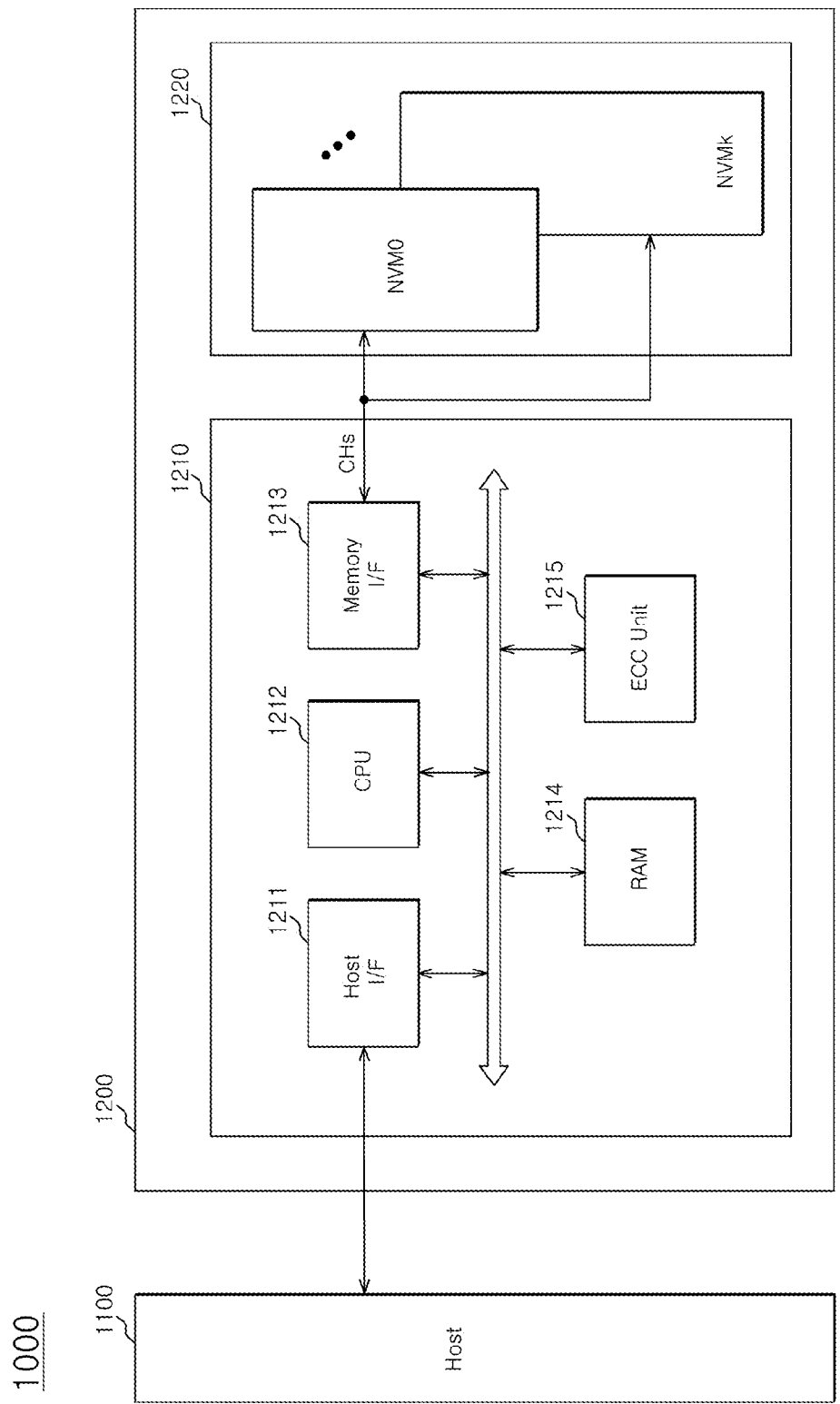
FIG. 7 is a block diagram illustrating a data processing system including the semiconductor memory device according to an embodiment of the present invention.

FIG. 7 is a block diagram illustrating a data processing system including the semiconductor memory device according to an embodiment of the present invention. Referring to FIG. 7, the data processing system 1000 includes a host 1100 and a data storage device 1200. The data storage device 1200 includes a controller 1210 and a data storage medium 1220. The data storage device 1200 may be coupled to the host 1100 such as a desktop computer, a notebook computer, a digital camera, a mobile phone, an MP3 player, a game machine or the like. The data storage device 1200 is also referred to as a memory system.

The controller 1210 is coupled to the host 1100 and the data storage medium 1220. The controller 1210 is configured to access the data storage medium 1220 in response to a request from the host 1100. For example, the controller 1210 is configured to control a read, program, or erase operation of the data storage medium 1220. The controller 1210 is configured to drive a firmware for controlling the data storage medium 1220.

The controller 1210 may include well-known components such as a host interface 1211, a central processing unit (CPU) 1212, a memory interface 1213, a RAM 1214, and an error correction code (ECC) unit 1215.

The CPU 1212 is configured to control overall operations of the controller 1210 in response to a request of the host. The RAM 1214 may be used as a working memory of the CPU 1212. The RAM 1214 may temporarily store data read from the data storage medium 1220 or data provided from the host 1100.

The host interface 1211 is configured to interface the host 1100 and the controller 1210. For example, the host interface 1211 may be configured to communicate with the host 1100 through one of a USB (Universal Serial Bus) protocol, a MMC (Multimedia Card) protocol, a PCI (Peripheral Component Interconnection) protocol, a PCI-E (PCI-Express) protocol, a PATA (Parallel Advanced Technology Attachment) protocol, a SATA (Serial ATA) protocol, an SCSI (Small Computer System Interface) protocol, and an IDE (Integrated Drive Electronics) protocol.

The memory interface 1213 is configured to interface the controller 1210 and the data storage medium 1220. The memory interface 1213 is configured to provide a command and an address to the data storage medium 1220. Furthermore, the memory interface 1213 is configured to exchange data with the data storage medium 1220.

The data storage medium 1220 may comprise the semiconductor memory device 100 of FIG. 1 according to an embodiment of the present invention. The data storage medium 1220 may include a plurality of semiconductor memory devices NVM0 to NVMk. As the data storage medium 1220 is configured with the semiconductor memory device 100 according to an embodiment of the present invention, the operation speed of the data storage device 1200 may be increased.

The ECC unit 1215 is configured to detect an error of the data read from the data storage medium 1220. Furthermore, the ECC unit 1215 is configured to correct the detected error, when the detected error falls within a correction range. The ECC unit 1215 may be provided inside or outside the controller 1210 depending on the memory system 1000.

The controller 1210 and the data storage medium 1220 may comprise a solid state drive (SSD).

As another example, the controller 1210 and the data storage medium 1220 may be integrated into one semiconductor device to form a memory card. For example, the controller 1210 and the data storage medium 1220 may be integrated into one semiconductor device to form a PCMCIA (personal computer memory card international association) card, a CF (compact flash) card, a smart media card, a memory stick, a multi-media card (MMC, RS-MMC, or MMC-micro), an SD (secure digital) card (SD, Mini-SD, or Micro-SD), or a UFS (universal flash storage) card.

As another example, the controller 1210 or the data storage medium 1220 may be mounted as various types of packages. For example, the controller 1210 or the data storage medium 1220 may is be packaged and mounted according to various methods such as POP (package on package), ball grid arrays (BGAs), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat package (MQFP), thin quad flat package (TQFP), small outline IC (SOIC), shrink small outline package (SSOP), thin small outline package (TSOP), thin quad flat package (TQFP), system in package (SIP), multi chip package (MCP), wafer-level fabricated package (WFP), and wafer-level processed stack package (WSP).

Figure 8:
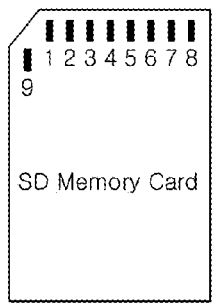
FIG. 8 illustrates a memory card including a semiconductor memory device according to an embodiment of the present invention.

FIG. 8 illustrates a memory card including the nonvolatile memory device according to an embodiment of the present invention. FIG. 8 illustrates the exterior of a secure digital (SD) memory card among memory cards.

Referring to FIG. 8, the SD memory card includes one command pin (for example, second pin), one clock pin (for example, fifth pin), four data pins (for example, first, seventh, eighth, and ninth pins), and three power supply pins (for example, third, fourth, and sixth pins).

Through the command pin (second pin), a command and a response signal are transferred. In general, the command is transmitted to the SD card from a host, and the response signal is transmitted to the host from the SD card.

The data pins (first, seventh, eighth, and ninth pins) are divided into receive (Rx) pins for receiving data transmitted from the host and transmit (Tx) pins for transmitting data to the host. The Rx pins and the Tx pins, respectively, may form a pair to transmit differential signals.

The SD card includes the semiconductor memory device 100 of FIG. 1 according to an embodiment of the present invention and a controller for controlling the semiconductor memory device. The controller included in the SD card may have the same configuration and function as the controller 1210 described with reference to FIG. 7.

Figure 9:
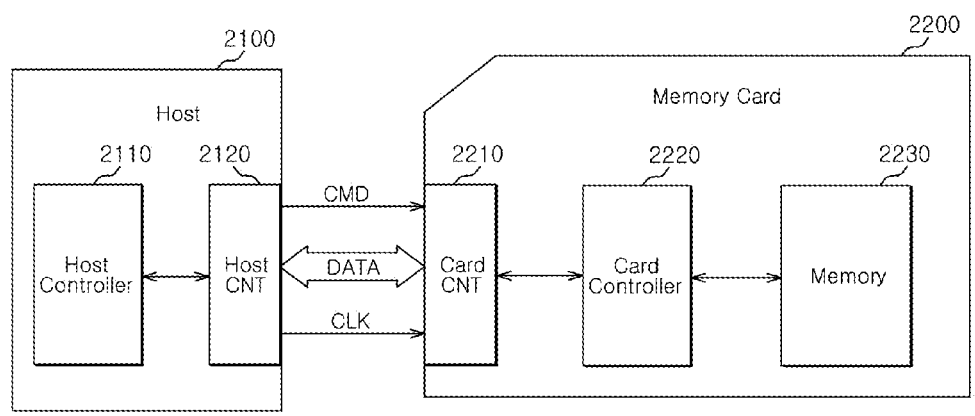
FIG. 9 is a block diagram illustrating the internal configuration of the memory card illustrated in FIG. 8 and the connection between the memory card and a host.

FIG. 9 is a block diagram illustrating the internal configuration of the memory card illustrated in FIG. 8 and the connection between the memory card and a host. Referring to FIG. 9, the data processing system 2000 includes a host 2100 and a memory card 2200. The host 2100 includes a host controller 2110 and a host connection unit 2120. The memory card 2200 includes a card connection unit 2210, a card controller 2220, and a memory device 2230.

The host connection unit 2120 and the card connection unit 2210 include a plurality of pins. The pins may include a command pin, a clock pin, a data pin, and a power supply pin. The number of pins may vary depending on the type of the memory card 2200.

The host 2100 stores data in the memory card 2200 or reads data stored in the memory card 2200.

The host controller 2110 transmits a write command CMD, a clock signal CLK generated from a clock generator (not illustrated) inside the host 2100, and data DATA to the memory card 2200 through the host connection unit 2120. The card controller 2220 operates in response to the write command received through the card connection unit 2210. The card controller 2220 stores the received data DATA in the memory device 2230, using a clock signal generated from a clock generator (not illustrated) inside the card controller 2220, according to the received clock signal CLK.

The host controller 2110 transmits a read command CMD and the clock signal CLK generated from the clock generator inside the host device 2100 to the memory card 2200 through the host connection unit 2120. The card controller 2220 operates in response to the read command received through the card connection unit 2210. The card controller 2220 reads data from the memory device 2230 using the clock signal generated from the clock generator inside the card controller 2220, according to the received clock signal CLK, and transmits the read data to the host controller 2110.

Figure 10:
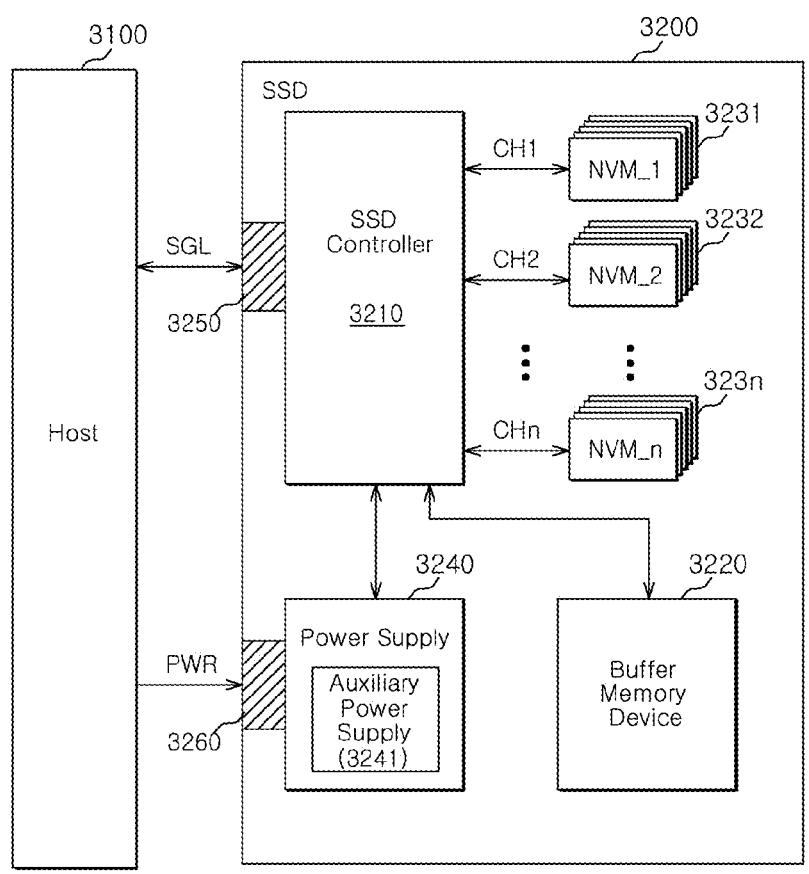
FIG. 10 is a block diagram illustrating an SSD including the semiconductor memory device according to an embodiment of the present invention.

FIG. 10 is a block diagram illustrating an SSD including the nonvolatile memory device according to an embodiment of the present invention. Referring to FIG. 10, a data processing system 3000 includes a host device 3100 and an SSD 3200.

The SSD 3200 includes an SSD controller 3210, a buffer memory device 3220, a plurality of nonvolatile memory devices 3231 to 323n, a power supply 3240, a signal connector 3250, and a power connector 3260.

The SSD 3200 operates in response to a request of the host device 3100. That is, the SSD controller 3210 is configured to access the nonvolatile memory devices 3231 to 323n in response to a request from the host 3100. For example, the SSD controller 3210 is configured to control read, program, and erase operations of the nonvolatile memory devices 3231 to 323n.

The buffer memory device 3220 is configured to temporarily store data which are to be stored in the nonvolatile memory devices 3231 to 323n. Furthermore, the buffer memory device 3220 is configured to temporarily store data read from the nonvolatile memory devices 3231 to 323n. The data which are temporarily stored in the buffer memory device 3220 are transmitted to the host 3100 or the nonvolatile memory devices 3231 to 323n, according to the control of the SSD controller 3210.

The nonvolatile memory devices 3231 to 323n are used as storage media of the SSD 3200. Each of the nonvolatile memory devices 3231 to 323n may have the same configuration as the semiconductor memory device 100 of FIG. 1 according to the embodiment of the present invention. Each of the nonvolatile memory devices 3231 to 323n may be configured with any one of nonvolatile memory devices such as PRAM, MRAM, ReRAM, and FRAM.

The respective nonvolatile memory devices 3231 to 323n are coupled to the SSD controller 3210 through a plurality of channels CH1 to CHn. One channel may be coupled to one or more nonvolatile memory devices. The nonvolatile memory devices coupled to one channel may be coupled to the same signal bus and data bus.

The power supply 3240 is configured to provide power PWR inputted through the power connector 3260 into the SSD 3200. The power supply 3240 includes an auxiliary power supply 3241. The auxiliary power supply 3241 is configured to supply power to normally terminate the SSD 3200, when sudden power off occurs. The auxiliary power supply 3241 may include super capacitors capable of storing power PWR.

The SSD controller 3210 is configured to exchange signals SGL with the host 3100 through the signal connector 3250. Here, the signals SGL may include commands, addresses, data and the like. The signal connector 3250 may be configured with a connector such as PATA (Parallel Advanced Technology Attachment), SATA (Serial Advanced Technology Attachment), SCSI (Small Computer System Interface), or SAS (Serial SCSI), according to the interface method between the host 3100 and the SSD 3200.

Figure 11:
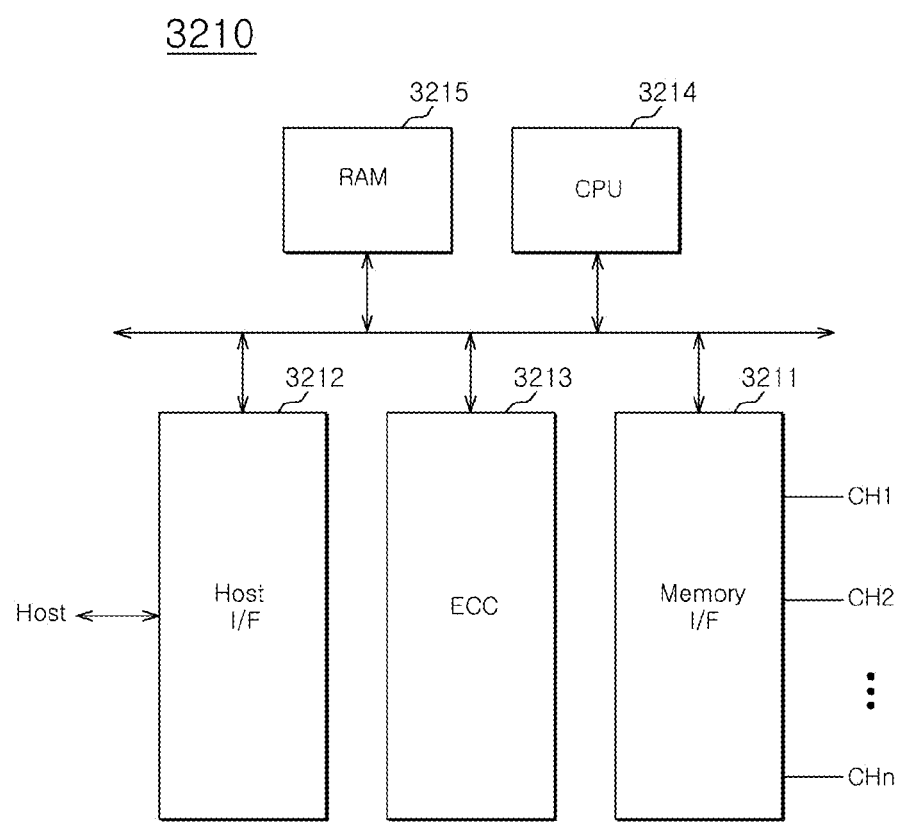
FIG. 11 is a block diagram illustrating the SSD controller illustrated in FIG. 10.

FIG. 11 is a block diagram illustrating the SSD controller illustrated in FIG. 10. Referring to FIG. 11, the SSD controller 3210 includes a memory interface 3211, a host interface 3212, an ECC unit 3213, a CPU 3214, and a RAM 3215.

The memory interface 3211 is configured to provide a command and an address to the nonvolatile memory devices 3231 to 323n. Furthermore, the memory interface 3211 is configured to exchange data with the nonvolatile memory devices 3231 to 323n. The memory interface 3211 may scatter data transferred from the buffer memory device 3220 over the respective channels CH1 to CHn, according to the control of the CPU 3214. Furthermore, the memory interface 3211 transfers data read from the nonvolatile memory devices 3231 to 323n to the buffer memory device 3220, according to the control of the CPU 3214.

The host interface 3212 is configured to provide an interface with the SSD 3200 in response to the protocol of the host 3100. For example, the host interface 3212 may be configured to communicate with the host 3100 through one of PATA (Parallel Advanced Technology Attachment), SATA (Serial Advanced Technology Attachment), SCSI (Small Computer Small Interface), SAS (Serial SCSI) protocols. Furthermore, the host interface 3212 may perform a disk emulation function of supporting the host 3100 to recognize the SSD 3200 as a hard disk drive (HDD).

The ECC unit 3213 is configured to generate parity bits based on the data transmitted to the nonvolatile memory devices 3231 to 323n. The generated parity bits may be stored in spare areas of the nonvolatile memory devices 3231 to 323n. The ECC unit 3213 is configured to detect an error of data read from the nonvolatile memory devices 3231 to 323n. When the detected error falls within a correction range, the ECC unit 3213 may correct the detected error.

The CPU 3214 is configured to analyze and process a signal SGL inputted from the host 3100. The CPU 3214 controls overall operations of the SSD controller 3210 in response to a request of the host 3100. The CPU 3214 controls the operations of the buffer memory device 3220 and the nonvolatile memory devices 3231 to 323n according to firmware for driving the SSD 3200. The RAM 3215 is used as a working memory device for driving the firmware.

Figure 12:
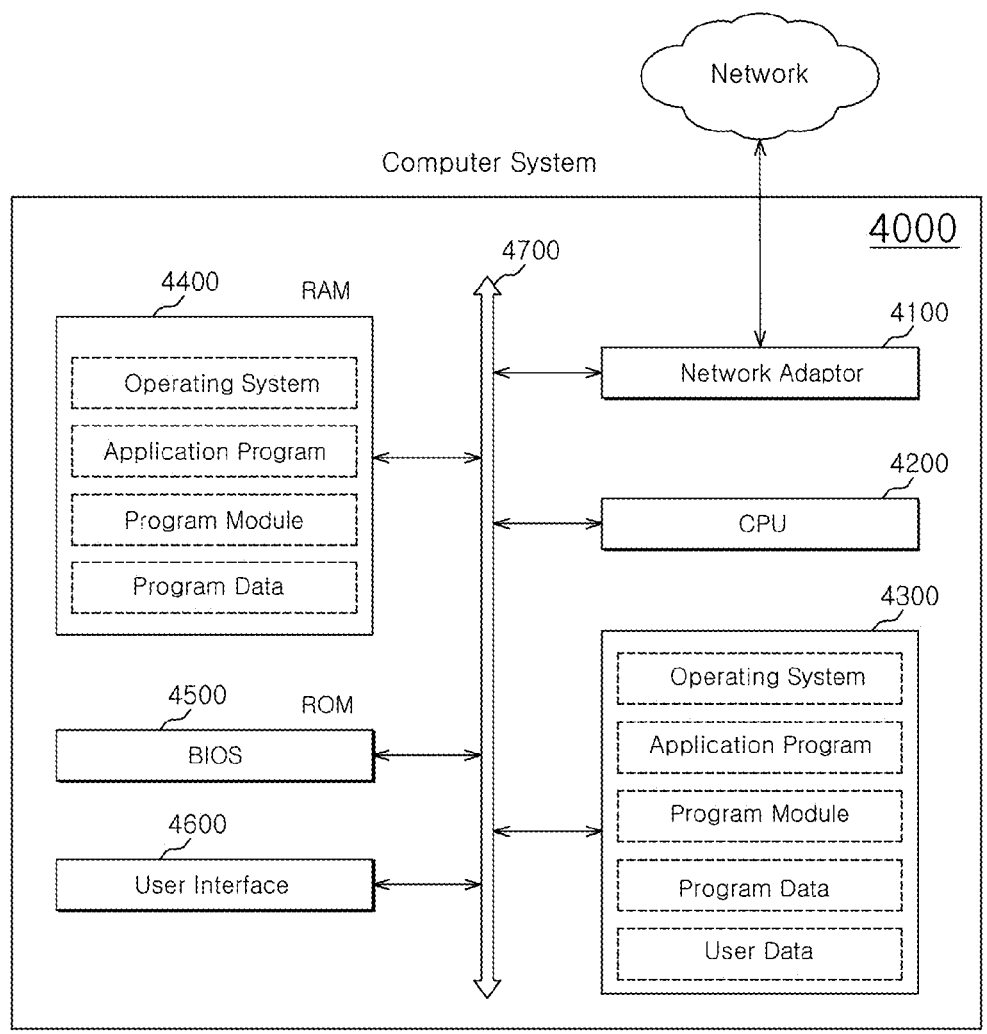
FIG. 12 is a block diagram illustrating a computer system in which a data storage device having the semiconductor memory device according to an embodiment of the present invention is mounted.

FIG. 12 is a block diagram illustrating a computer system in which a data storage device having the nonvolatile memory device according to an embodiment of the present invention is mounted. Referring to FIG. 12, the computer system 4000 includes a network adapter 4100, a CPU 4200, a data storage device 4300, a RAM 4400, a ROM 4500, and a user interface 4600, which are electrically coupled to the system bus 4700. Here, the data storage device 4300 may be configured with the data storage device 1200 illustrated in FIG. 7 or the SSD 3200 illustrated in FIG. 10.

The network adapter 4100 is configured to provide an interface between the computer system 400 and external networks. The CPU 4200 is configured to perform overall arithmetic operations for driving an operating system or application programs staying in the RAM 4400.

The data storage device 4300 is configured to store overall data required by the computer system 4000. For example, the operating system for driving the computer system 4000, application programs, various program modules, program data, and user data may be stored in the data storage device 4300.

The RAM 4400 may be used as a working memory device of the computer system 4000. During booting, the operating system, application programs, various program modules, which are read from the data storage device 4300, and program data required for driving the programs are loaded into the RAM 4400. The ROM 4500 stores a basic input/output system (BIOS) which is enabled before the operating system is driven. Through the user interface 4600, information exchange is performed between the computer system 4000 and a user.

Although not illustrated in the drawing, the computer system 4000 may further include a battery, application chipsets, a camera image processor (CIP) and the like.

While certain embodiments have been described above, it will be understood to those skilled in the art that the embodiments described are by way of example only. Accordingly, the device and method described herein should not be limited based on the described embodiments. Rather, the device and method described herein should only be limited in light of the claims that follow when taken in conjunction with the above description and accompanying drawings.

What is claimed is:

1. A reading method of a semiconductor memory device having a multi-level memory cell, comprising the steps of:
   reading flag data indicating whether the most significant bit (MSB) of data programmed in the multi-level memory cell is programmed or not;
   storing the read flag data;
   reading the least significant bit (LSB) of the data programmed in the multi-level memory cell, based on the read flag data;
   reading the MSB of the data programmed in the multi-level memory cell based on the stored flag data, and
   wherein when a read operation for reading the MSB is requested immediately after the step of reading the LSB, the step of reading the MSB based on the stored flag data is performed.

2. The reading method according to claim 1, further comprising the steps of:
   storing a row address for reading the LSB; and
   comparing a row address for reading the MSB with an address obtained by increasing the stored row address by one.

3. The reading method according to claim 2, wherein when the row address for reading the MSB is equal to the increased address, the step of reading the MSB based on the stored flag data is performed.

4. The reading method according to claim 2, wherein when the row address for reading the MSB is different from the increased address, the flag data is read again, and the MSB of the data programmed in the multi-level memory cell is read based on the read flag data.

5. The reading method according to claim 1, wherein the stored flag data maintains a value thereof until the read operation for reading the MSB is completed.

6. A semiconductor memory device comprising:
   a memory cell array comprising a multi-level memory cell and a flag memory cell configured to store information on whether the MSB of data programmed in the multi-level memory cell is programmed or not;
   a data input/output circuit configured to read data programmed in the multi-level memory cell and the flag memory cell, and temporarily store the read data; and a control logic configured to control the read operations for the multi-level memory cell and the flag memory cell through the data input/output circuit, wherein the control logic reads the MSB of the data programmed in the multi-level memory cell based on flag data which is read and stored when reading the LSB of the data programmed in the multi-level memory cell, and wherein the control logic comprises a flag data storing unit configured to store the flag data read when the LSB is read, and performs the MSB read operation based on the flag data stored in the flag data storing unit.

7. The semiconductor memory device according to claim 6, wherein the control logic successively performs the operation of reading the LSB and the operation of reading the MSB, according to a request of an external device.

8. The semiconductor memory device according to claim 6, wherein the control logic comprises a row address storing unit configured to store a row address for reading the LSB.

9. The semiconductor memory device according to claim 8, wherein the control logic increases the row address stored in the row address storing unit by one and compares the increased row address with a row address for reading the MSB, during the MSB read operation.

10. The semiconductor memory device according to claim 9, wherein when the increased row address is equal to the row address for reading the MSB, the control logic performs the MSB read operation based on the stored flag data.

11. The semiconductor memory device according to claim 9, wherein when the increased row address is different from the row address for reading the MSB, the control logic reads data of the flag memory cell through the data input/output circuit, and performs the MSB read operation based on the read flag data.

12. A data storage device comprising:
a semiconductor memory device; and
a controller configured to control the semiconductor memory device,
wherein the semiconductor memory device comprises:
a memory cell array comprising a multi-level memory cell and a flag memory cell configured to store information on whether the MSB of data programmed in the multi-level memory cell is programmed or not;
a data input/output circuit configured to read data programmed in the multi-level memory cell and the flag memory cell and temporarily store the read data; and
a control logic configured to control the read operations for the multi-level memory cell and the flag memory cell through the data input/output circuit, and
the control logic reads the MSB of the data programmed in the multi-level memory cell based on the flag data which is read and stored when reading the LSB of the data programmed in the multi-level memory cell,
wherein the control logic comprises a flag data storing unit configured to store the flag data read when the LSB is read, and performs the MSB read operation based on the flag data stored in the flag data storing unit.

13. The data storage device according to claim 12, wherein the semiconductor memory device and the controller are configured as a solid state drive (SSD).

14. The data storage device according to claim 12, wherein the control logic successively performs the operation of reading the LSB and the operation of reading the MSB, according to a request of an external device.

15. The data storage device according to claim 12, wherein the control logic comprises a row address storing unit configured to store a row address for reading the LSB.

16. The data storage device according to claim 15, wherein the control logic increases the row address stored in the row address storing unit by one and compares the increased row address with a row address for reading the MSB, during the MSB read operation.

17. The data storage device according to claim 16, wherein when the increased row address is equal to the row address for reading the MSB, the control logic performs the MSB read operation based on the stored flag data.

18. The semiconductor memory device according to claim 16, wherein when the increased row address is different from the row address for reading the MSB, the control logic reads data of the flag memory cell through the data input/output circuit, and performs the MSB read operation based on the read flag data.

* * * * *